United States Patent
Chapelon et al.

(10) Patent No.: US 8,674,517 B2
(45) Date of Patent: Mar. 18, 2014

(54) METHOD OF ASSEMBLING TWO INTEGRATED CIRCUITS AND CORRESPONDING STRUCTURE

(75) Inventors: Laurent-Luc Chapelon, Domene (FR); Mohamed Bouchoucha, Grenoble (FR)

(73) Assignee: STMicroelectronics (Crolles 2) SAS, Crolles (FR)

(*) Notice: Subject to any disclaimer, the term of this patent is extended or adjusted under 35 U.S.C. 154(b) by 0 days.

(21) Appl. No.: 13/328,175

(22) Filed: Dec. 16, 2011

(65) Prior Publication Data
US 2012/0153475 A1 Jun. 21, 2012

(30) Foreign Application Priority Data
Dec. 16, 2010 (FR) ..................... 10 60637

(51) Int. Cl.
*H01L 23/488* (2006.01)
*H01L 21/50* (2006.01)
(52) U.S. Cl.
USPC ............. 257/777; 257/621; 257/E21.499; 257/E21.538; 438/107; 438/613; 438/667; 438/672
(58) Field of Classification Search
USPC ............. 257/621, 777, E21.499, E21.538; 438/107, 613, 667, 672
See application file for complete search history.

(56) References Cited

U.S. PATENT DOCUMENTS

| | | | |
|---|---|---|---|
| 6,362,529 B1 | 3/2002 | Sumikawa et al. | |
| 2001/0038152 A1* | 11/2001 | Chen | 257/786 |
| 2002/0047212 A1* | 4/2002 | Chen | 257/777 |
| 2005/0263869 A1 | 12/2005 | Tanaka et al. | |
| 2005/0266670 A1 | 12/2005 | Lin et al. | |
| 2006/0278991 A1 | 12/2006 | Kwon et al. | |
| 2007/0048969 A1* | 3/2007 | Kwon et al. | 438/455 |
| 2007/0205520 A1* | 9/2007 | Chou et al. | 257/780 |
| 2008/0023829 A1 | 1/2008 | Kok et al. | |
| 2009/0309235 A1* | 12/2009 | Suthiwongsunthorn et al. | 257/777 |

FOREIGN PATENT DOCUMENTS

DE 102006045094 3/2008
WO 2010094511 8/2010

* cited by examiner

*Primary Examiner* — Peniel M Gumedzoe
(74) *Attorney, Agent, or Firm* — Allen, Dyer, Doppelt, Milbrath & Gilchrist, P.A.

(57) ABSTRACT

A semiconductor device includes an assembly of two integrated circuits. The assembly has a layer of photoresist filling the space between the two integrated circuits, and at least one electrically conducting pillar within the resist and electrically coupling the two integrated circuits.

14 Claims, 3 Drawing Sheets

US 8,674,517 B2

METHOD OF ASSEMBLING TWO INTEGRATED CIRCUITS AND CORRESPONDING STRUCTURE

FIELD OF THE INVENTION

The invention relates to integrated circuits, and, more particularly, to the assembly of two integrated circuits produced independently, so as to produce an integrated three-dimensional structure.

BACKGROUND OF THE INVENTION

Assemblies of integrated circuits generally comprise at least two integrated circuits fabricated independently and then joined together by a system of electrical connections placed between the two integrated circuits. These electrical connections are generally fabricated on each of the two integrated circuits and then soldered during a melting step.

During fabrication of these assemblies, electrically conducting through-vias (also known as Through Silicon Vias or TSVs) may also be produced within at least one of the integrated circuits. These vias make it possible to produce assemblies in which the frontside of one integrated circuit is against the backside of another integrated circuit. Thus, in such assemblies, called face-to-back assemblies, the through-vias electrically connect the metal lines of one integrated circuit and the electrical connections placed between the two integrated circuits.

Moreover, in assemblies in which the frontside of one integrated circuit is against the frontside of another integrated circuit, called face-to-face assemblies, the through-vias serve, for example, for connecting the assembly to a printed circuit using the flip-chip process well known to those skilled in the art.

A conventional assembly of two integrated circuits has been shown in FIG. 1. In this figure, two integrated circuits 101 and 102 have been shown schematically.

The circuit IC1 comprises, conventionally, a silicon substrate SUB and a number of metal lines LM. The metal lines LM form a BEOL (Back End Of Line) system interconnection of between the components of the integrated circuits. To join the backside of the integrated circuit IC1 to the frontside of the integrated circuit IC2 (face-to-back assembly), an electrically conducting through-via TSV1 is produced within the integrated circuit IC1.

More precisely, the substrate SUB of the integrated circuit IC1 is firstly thinned, for example by a mechanical polishing step, and then a through-orifice ORI is formed on the backside of the integrated circuit IC1. This through-orifice ORI opens onto at least one metal line LM of the integrated circuit IC1.

An insulating layer ISO, for example of silicon dioxide $SiO_2$, is then deposited on the walls of the orifice ORI and on the backside of the integrated circuit IC1. The orifice ORI may have an aspect ratio of for example around 2 or 3, i.e. for example a height of 120 microns for a width of 60 microns, giving an aspect ratio of 2.

An electrically conducting layer RDL1 is then deposited on the walls of the orifice ORI, on the insulating layer ISO, and partially on top of the backside of the integrated circuit IC1. This conducting layer, generally called a redistribution line, is in electrical contact with a metal line LM and extends on top of at least part of the backside of the first integrated circuit IC1. The conducting layer RDL1 comprises a copper layer deposited on a tantalum layer that promotes adhesion of the copper, the tantalum layer itself being deposited on a tantalum nitride layer for limiting the diffusion of copper into the silicon.

The formation of the conducting layer RDL1 is followed by a step of depositing a photoresist RES1. The photoresist RES1 does not fill the orifice ORI, and has a thickness of around 2 microns.

To form an electrical connection between the integrated circuit IC1 and the integrated circuit IC2, a cavity is formed within the photoresist RES1 by a photolithography step. This cavity opens onto the conducting layer RDL1.

A layer forming a copper diffusion barrier/tie layer is then deposited on the backside of the integrated circuit IC1. This tie layer is covered with a second photoresist in which a cavity opening onto the conducting layer RDL1 is formed by a photolithography step. A copper electroplating step then enables the cavity opening onto the conducting layer RDL1 to be filled and a copper pillar CUP1 to be formed. The second photoresist together with the first photoresist makes it possible to obtain a sufficient thickness that a copper pillar CUP1 of sufficient height can be formed.

The second photoresist and the copper tie layer are then removed. A conducting region RDL2, for example made of copper, is placed on the second integrated circuit IC2, on the frontside of the integrated circuit IC2, and a copper pillar CUP2 is then formed on this conducting region.

More precisely, the production of the copper pillar CUP2 is preceded by a passivation of the conducting region RDL2 by means of a layer of silicon nitride ($Si_3N_4$), and an opening is made in this silicon nitride layer at the position of the copper pillar CUP2 by means of a photolithography step and a copper barrier/tie layer is deposited.

To create an electrical contact between the two integrated circuits IC1 and IC2, a low-melting-point alloy SAC is placed on the copper pillar CUP2. The combination formed by the copper pillar CUP2 and the alloy SAC is commonly referred to as just a "Copper Pillar". This combination may have a thickness of around 30 microns.

A layer of polymer resin WLUF (Wafer Level Under-Fill) is then deposited on the frontside of the integrated circuit IC2 so as to cover the copper pillar CUP2 and the alloy SAC. When assembling the two integrated circuits, the alloy SAC is soldered to the pillar CUP1 and the layer WLUF is cured during a soft bake and fills the space between the two integrated circuits IC1 and IC2.

The assembly obtained has, in particular, the drawback of a cavity being formed in the orifice ORI. This cavity may result in gas being encapsulated and may cause the assembly to fail. This cavity may also cause oxidation of the copper.

Furthermore, this method for assembling the integrated circuits IC1 and IC2 comprises a large number of steps, more particularly two photolithography steps for depositing the two photoresist layers, the deposition of a tie layer, the deposition of copper, the deposition of the alloy SAC and the deposition of the polymer layer WLUF.

Moreover, the use of the polymer layer WLUF has the drawback of using tall copper pillars CUP1 and CUP2, for example having a total height of 40 microns, i.e. 10 microns for the pillar CUP1 and 30 microns for the pillar CUP2/alloy SAC combination.

SUMMARY OF THE INVENTION

According to one method of implementation and one embodiment, the invention simplifies the assembly of at least two integrated circuits.

According to one aspect, the invention provides a method of assembling two integrated circuits. The method includes depositing a layer of photoresist on a first side, for example the backside, of a first integrated circuit. At least one cavity is formed in the layer of photoresist, the cavity opening onto an electrically conducting portion of the first integrated circuit. A conducting pillar is produced to partially fill the cavity and come into contact with the electrically conducting portion. At least one electrically conducting projection is formed on a first side of a second integrated circuit. Also, the two first sides are joined together, the projection coming into contact with the conducting pillar so as to fill the cavity, and the photoresist filling the space between the two integrated circuits.

Thus, a single photoresist is used to form the cavity or cavities for producing the electrical connection between the two integrated circuits and for filling the space between the two integrated circuits. A single photolithography step is carried out using this photoresist in order to produce the at least one cavity.

A person skilled in the art will adjust the viscosity of the photoresist according to the desired thickness. As an indication, a viscosity range between 1500 centipoise and 4000 centipoise is suitable.

The photoresist may be an initially liquid resin. As a variant, the photoresist may be a dry film.

Advantageously, production of the conducting pillar comprises a step of screen-printing a conductive paste. Thus, it is not necessary to deposit a copper barrier/tie layer in order to form a conducting pillar. The screen-printing step makes it possible to use the photoresist layer as a mask through which a conductive paste is applied.

The conductive paste may comprise tin-silver alloy particles and copper particles. The alloy used for the conductive paste thus has a low melting point, enabling the conducting pillar to be soldered to the projection of the second integrated circuit.

Since the paste used comprises metal (tin-silver and copper) particles having a diameter of between 1 and 3 microns for example, embedded in a solder flux, the pillar obtained here differs by its microstructure (tin-silver-copper trunk) from a pillar according to the prior art (copper trunk topped by a dome made of tin-silver-copper alloy).

The method may comprise, prior to the deposition of said photoresist, thinning the substrate of the first integrated circuit, and forming a through-orifice in the substrate. The method may further includes forming an electrically conducting layer on at least the walls of the through-orifice to come into electrical contact with at least one metal line of a metallization level of the first integrated circuit and extend above at least part of said first side so as to form said electrically conducting portion. The through-orifice is completely filled by the photoresist during the deposition of the latter.

Thus, a face-to-back assembly is obtained without forming a cavity in the through-orifice. Moreover, the through-orifice is filled during the step of depositing the photoresist in which the conducting pillar is formed.

The filling of the through-orifice with the photoresist is promoted by carrying out a low-temperature vacuum annealing operation on the deposited photoresist. The filling of the through-orifice with the photoresist improves the reliability as the air pocket trapped in the through-orifices of the prior art, which may oxidize the copper present in the through-orifices and/or damage the photoresist membrane that forms this air pocket, is eliminated.

According to another aspect, the invention provides a semiconductor device comprising an assembly of two integrated circuits, the assembly including a layer of photoresist filling the space between the two integrated circuits, and at least one electrically conducting pillar provided within the photoresist and electrically connecting the two integrated circuits. Advantageously, the at least one electrically conducting pillar at least partly comprises a conductive paste comprising metal particles.

The metal particles may comprise tin-silver alloy particles and copper particles. The substrate of one of the two integrated circuits comprises an electrically conducting through-via the internal part of which is completely filled by the photoresist.

BRIEF DESCRIPTION OF THE DRAWINGS

Other advantages and features of the invention will become apparent on studying the detailed description of methods of implementation and embodiments given by way of nonlimiting examples and illustrated by the appended drawings in which.

DETAILED DESCRIPTION OF THE PREFERRED EMBODIMENTS

Figure 1:
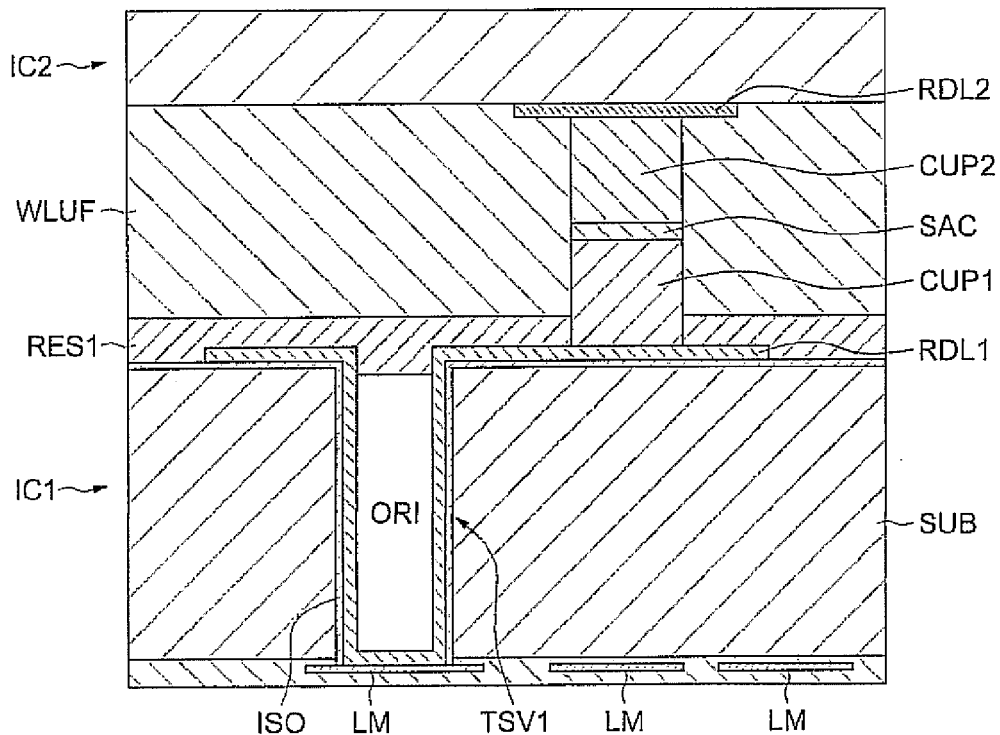
FIG. 1, already described, illustrates schematically an assembly of two integrated circuits according to the prior art.
Figure 2:
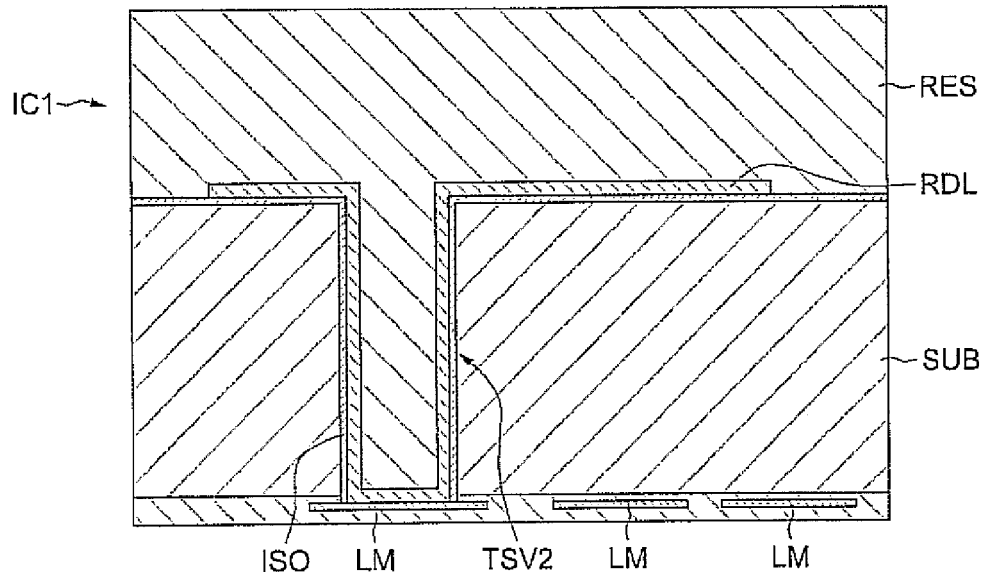
FIGS. 2 to 6 illustrate one method of implementation and one embodiment according to the present invention.

FIG. 2 shows schematically a first integrated circuit IC1. The integrated circuit IC1 is produced in a silicon substrate SUB and comprises a number of metal lines LM. The metal lines LM form here the BEOL part of the integrated circuit IC1.

To join a second integrated circuit to the backside of the integrated circuit IC1, an electrically conducting through-via TSV2 is produced. The substrate SUB is firstly thinned down to a thickness of, for example 120 microns, and a through-orifice is formed in the backside of the integrated circuit IC1. This orifice may have a width of around 60 microns so as to obtain an aspect ratio of 2. It is also conceivable to obtain aspect ratios of around 1 or 3.

An insulating layer ISO, for example of silicon dioxide ($SiO_2$), is deposited on the walls of the through-orifice and on the backside of the integrated circuit IC1.

After the bottom part of the layer ICO has been etched, an electrically conducting layer RDL1 forming a redistribution line connected to a metal line LM is deposited on the walls of the orifice ORI, on the insulating layer ISO, and partially on top of the backside of the integrated circuit IC1. The conducting layer RDL1 comprises a copper layer deposited on a tantalum layer, making it possible to promote adhesion of the copper, the tantalum layer itself being deposited on a tantalum nitride layer for limiting the diffusion of copper into the silicon. The copper of the electrically conducting layer RDL1 may be deposited during an electroplating step by means of a layer of photoresist open at the location of the layer RDL1.

A layer of photoresist RES is then deposited on the backside of the integrated circuit IC1. This photoresist may be deposited by a Spin Coating step. The photoresist RES completely fills the through-orifice of the via TSV2. Moreover, the layer of photoresist RES passivates, i.e. protects, the entire backside of the integrated circuit IC1.

A person skilled in the art will adjust the characteristics of the photoresist, for example its viscosity, so as to be able to both completely fill the orifice of the through-via TSV2 and obtain a sufficient thickness for subsequently producing a conducting pillar.

For example, a photoresist with a viscosity between 1500 and 4000 centipoise may be used. Moreover, to promote filling of the orifice TSV2 it is advantageous, after the photoresist has been deposited, to carry out a low-temperature vacuum annealing step, for example at a temperature of less than 100° C., at a pressure of between 10 and 50 millibars, and for a time of between 10 and 30 minutes.

For example, an initially liquid photoresist sold under the name TMMR by the Japanese company TOK may be used. As a variant, the photoresist may be a dry film, for example a dry film sold under the name TMMF by the Japanese company TOK. This photoresist may be deposited during a lamination step and may also fill the orifice of the through-via TSV2.

Figure 3:
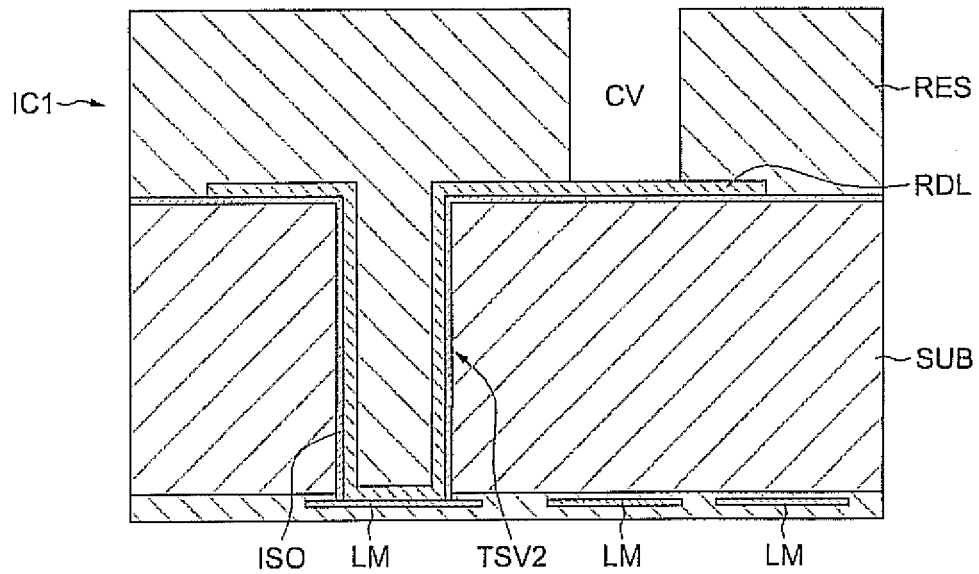

The aforementioned photoresist examples thus make it possible to obtain a thickness of the photoresist layer RES ranging from 1 micron up to around 100 microns. The photoresist RES is then exposed during a photolithography step so as to form a cavity CV (FIG. 3). The remaining, for example liquid, photoresist RES is then cured during a curing anneal.

Advantageously, an annealing step called a soft bake is carried out before exposure. This soft bake makes it possible to obtain a photoresist sufficiently robust for preserving the feature formed by the cavity CV.

The cavity CV opens onto a portion of the redistribution line RDL located on the backside of the integrated circuit IC1. The cavity CV may also have a very high aspect ratio.

Figure 4:
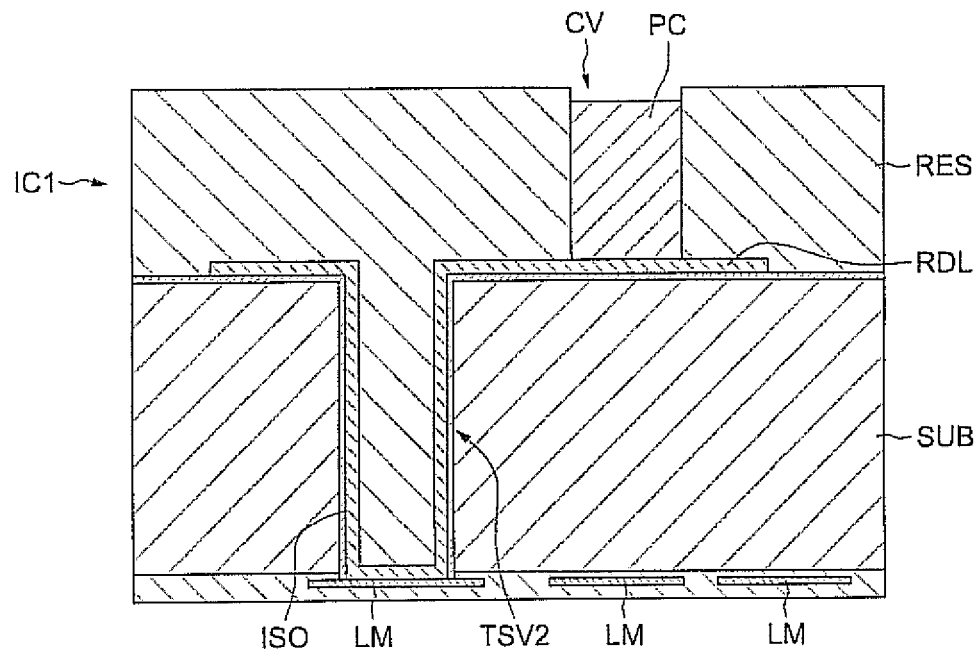

FIG. 4 shows the integrated circuit IC1 after a step of screen printing a conductive paste (also called a vacuum paste printing step). During this step, a conducting pillar PC is produced in the cavity CV. The conducting pillar PC partially fills the cavity CV. For example, the pillar has a height of 20 microns.

The screen printing step makes it possible to produce the conducting pillar PC without using a tie layer or an electroplating step, the photoresist serving as a mask for producing the pillar.

The conductive paste of the conducting pillar PC may comprise tin-silver alloy particles and copper particles, for example particles with a diameter of the order of 1 micron, held together in a solder flux. It is possible, for example, to use a conductive paste known to those skilled in the art, for example to form connection bumps during flip-chip assembly operations.

Figure 5:
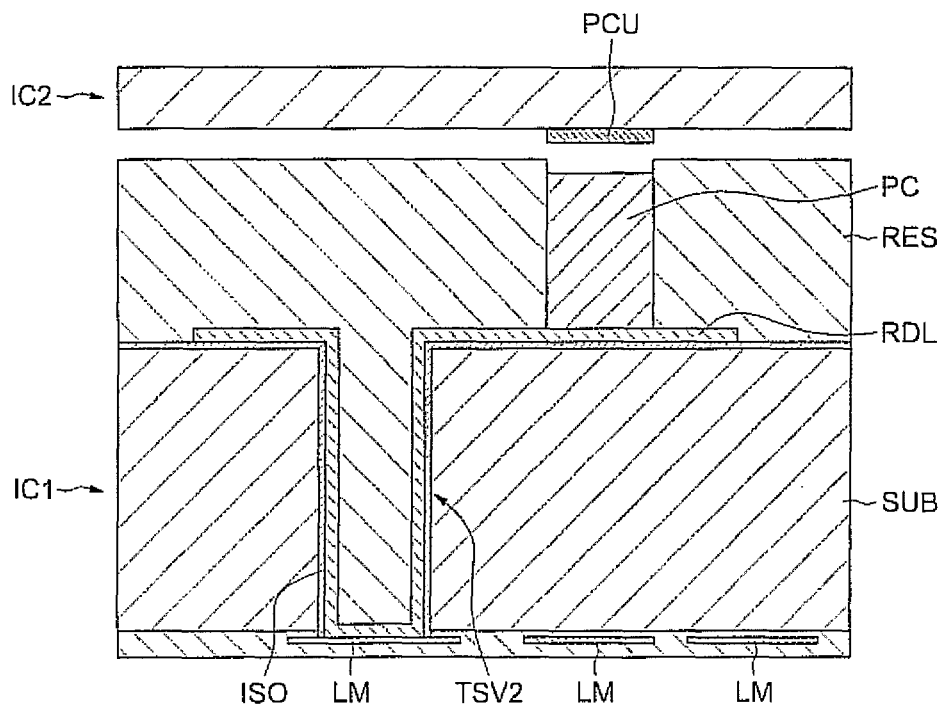

FIG. 5 shows a second integrated circuit IC2 intended to be joined to the backside of the integrated circuit IC1. The integrated circuit IC2 comprises, for example on its frontside, a copper projection PCU. The copper projection PCU is electrically connected to at least one metal line of the integrated circuit IC2.

The copper projection PCU may be produced in steps, especially deposition of a copper tie layer, deposition of a resist, and deposition of copper in a cavity of the resist by electroplating through an insulating layer open at the location of the copper projection.

Furthermore, this projection PCU may have a thickness of the order of ten microns.

Figure 6:
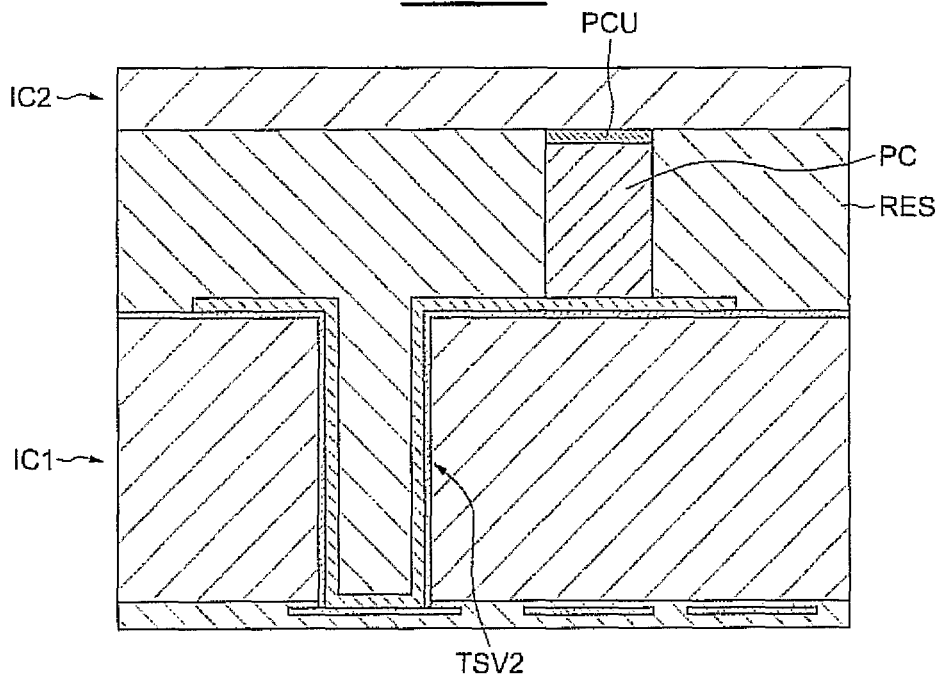

FIG. 6 shows the integrated circuits IC1 and IC2 assembled. The projection PCU completely fills the cavity CV partly filled by the pillar PC, and the resist RES completely fills the space between the two integrated circuits.

During a soft bake, the conductive paste of the conducting pillar PC makes contact with the projection PCU. More precisely, the tin-silver alloy particles melt onto the copper particles and form a homogeneous conducting assembly (tin-silver-copper trunk). This soft bake also enables the resist RES to be cured.

A semiconductor device is obtained that comprises an assembly of two integrated circuits IC1 and IC2, the assembly comprising a layer of photoresist RES filling the space between the two integrated circuits. At least one electrically conducting pillar PC is provided within the resist RES that at least partly comprises a conductive paste, including tin-silver-alloy particles and copper particles, and electrically connecting the two integrated circuits IC1 and IC2.

Furthermore, the substrate of one of the two integrated circuits includes an electrically conducting through-via TSV2, the internal part of which is completely filled by said photoresist. It should be noted that according to one aspect of the invention it is possible to obtain short conducting pillars, enabling the two integrated circuits to be close together.

The alignment of the two integrated circuits is facilitated, this alignment being obtained when the copper projection PCU is inserted into the cavity CV.

According to one aspect of the invention, a method of assembling two integrated circuits is obtained that comprises a single deposition of photoresist, in which a single photolithography step is used to produce a conducting pillar. The assembly method is also simplified during face-to-back assembly, the photoresist being capable of filling the through-orifices.

Moreover, the screen-printing method used to form the conducting pillars makes it possible to obtain pillars that are thin, and therefore a larger number of electrical connections for each assembly.

It should also be noted that the deposition of the resist and the formation of the conducting pillars may be carried out on the frontside of an integrated circuit in the case of a face-to-face assembly.

Finally, it should be noted that the complete filling of a through-orifice simultaneously with the passivation of one side of an integrated circuit may be carried out using said photoresist without producing a conducting pillar.

That which is claimed is:

1. A method of assembling first and second integrated circuits comprising:
   forming a layer of photoresist on a first side of the first integrated circuit;
   forming at least one cavity in the layer of photoresist, the at least one cavity opening onto an electrically conducting portion of the first integrated circuit;
   forming a conducting pillar to partially fill the at least one cavity and contact the electrically conducting portion;
   forming at least one electrically conducting projection on a first side of the second integrated circuit; and
   joining the two first sides of the first and second integrated circuits such that the projection contacts the conducting pillar so as to fill the cavity, and such that the photoresist fills a space between the two integrated circuits.

2. A method according to claim 1, wherein the photoresist comprises a cured resin.

3. A method according to claim 1, wherein the photoresist comprises a dry film.

4. A method according to claim 1, wherein the conducting pillar is formed by screen-printing a conductive paste.

5. A method according to claim 4, wherein the conductive paste comprises tin-silver alloy particles and copper particles.

6. A method according to claim 1, comprising, prior to depositing the layer of photoresist:
   thinning a substrate of the first integrated circuit;
   forming a through-hole in the substrate; and forming an electrically conducting layer on walls of the through-hole such that the electrically conducting layer is electrically coupled to at least one metal line of a metallization level of the first integrated circuit, and extends above at least part of the first side of the first integrated circuit; and wherein the through-hole is filled by the photoresist during deposition thereof.

7. A method of making an electronic device comprising:
forming a layer of photoresist on a first integrated circuit;
forming at least one cavity in the layer of photoresist, the at least one cavity opening onto an electrically conducting portion of the first integrated circuit;
forming a conducting pillar in the at least one cavity such that the conductive pillar is recessed within the cavity and contacts the electrically conducting portion;
forming at least one electrically conducting projection on a second integrated circuit; and
joining the first and second integrated circuits such that the projection contacts the conducting pillar recessed within the cavity.

8. A method according to claim 7, wherein the photoresist comprises a cured resin.

9. A method according to claim 7, wherein the photoresist comprises a dry film.

10. A method according to claim 7, wherein the conducting pillar is formed by screen-printing a conductive paste.

11. A method according to claim 10, wherein the conductive paste comprises tin-silver alloy particles and copper particles.

12. A semiconductor device comprising:
a first integrated circuit including a first side and comprising
an electrically conducting portion on the first side,
at least one electrically conducting pillar comprising a conductive paste comprising metal particles and having a lower surface contacting the electrically conducting portion, and an upper surface, and
a layer of photoresist on the electrically conducting portion and surrounding the at least one electrically conducting pillar, with an upper surface of the layer of photoresist extending in height above the upper surface of the at least one electrically conducting pillar so as to define a recess therebetween; and
a second integrated circuit including a first side and an electrically conducting projection extending outwards from the first side, with the electrically conducting projection comprising copper and contacting the upper surface of the at least one electrically conducting pillar in the recess, and with the first side contacting the upper surface of the layer of photoresist.

13. A semiconductor device according to claim 12, wherein the metal particles comprise tin-silver alloy particles and copper particles.

14. A device according to claim 12 wherein the first integrated circuit comprises a substrate having an electrically conducting through-via filled by the layer of photoresist.

* * * * *